United States Patent
Chang et al.

(10) Patent No.: US 8,558,177 B2
(45) Date of Patent: Oct. 15, 2013

(54) AMBIT LIGHT SENSOR WITH FUNCTION OF IR SENSING

(75) Inventors: Jin-Wei Chang, Taoyuan County (TW); Jen-Yao Hsu, Hsinchu County (TW); Hong-Xian Wang, Hsinchu (TW); Yu-Hsien Chen, Kaohsiung (TW)

(73) Assignee: Maxchip Electronics Corp., Hsinchu (TW)

( * ) Notice: Subject to any disclaimer, the term of this patent is extended or adjusted under 35 U.S.C. 154(b) by 510 days.

(21) Appl. No.: 12/696,026

(22) Filed: Jan. 28, 2010

(65) Prior Publication Data

US 2011/0108728 A1    May 12, 2011

(30) Foreign Application Priority Data

Nov. 12, 2009 (TW) ................. 98138507 A

(51) Int. Cl.
   *G01J 5/00*    (2006.01)
(52) U.S. Cl.
   USPC ...................................... 250/338.1

(58) Field of Classification Search
   USPC ........................................ 250/338.1
   See application file for complete search history.

(56) References Cited

U.S. PATENT DOCUMENTS

| | | | |
|---|---|---|---|
| 5,157,473 A * | 10/1992 | Okazaki | 257/438 |
| 5,449,924 A * | 9/1995 | Hur et al. | 257/54 |
| 6,373,117 B1 | 4/2002 | Theil | |
| 7,592,593 B2 * | 9/2009 | Kauffman et al. | 250/332 |
| 7,888,763 B2 * | 2/2011 | Qian et al. | 257/460 |
| 7,960,699 B2 * | 6/2011 | Chang et al. | 250/338.4 |
| 2002/0025597 A1 * | 2/2002 | Matsuda | 438/57 |
| 2009/0200589 A1 | 8/2009 | Qian et al. | |
| 2010/0225628 A1 * | 9/2010 | Souchkov et al. | 345/207 |

* cited by examiner

*Primary Examiner* — Christine Sung
(74) *Attorney, Agent, or Firm* — Jianq Chyun IP Office

(57) ABSTRACT

An ambit light sensor with a function of IR sensing and a method of fabricating the same are provided. The ambit light sensor includes a substrate, an ambit light sensing structure, an infrared ray (IR) sensing structure, and a dielectric layer. The ambit light sensing structure is located over the substrate for sensing and filtering visible light. The IR sensing structure is located in the substrate under the ambit light sensing structure for sensing IR. The dielectric layer is located between the ambit light sensing structure and the IR sensing structure.

21 Claims, 6 Drawing Sheets

AMBIT LIGHT SENSOR WITH FUNCTION OF IR SENSING

CROSS-REFERENCE TO RELATED APPLICATION

This application claims the priority benefit of Taiwan application serial no. 98138507, filed Nov. 12, 2009. The entirety of the above-mentioned patent application is hereby incorporated by reference herein and made a part of specification.

BACKGROUND OF THE INVENTION

1. Field of the Invention

The invention relates to a sensor and a method of fabricating the same, and more particularly to an ambit light sensor with a function of infrared ray (IR) sensing and a method of fabricating the same.

2. Description of Related Art

In recent years, sensing devices have been playing importable roles in most industrial applications and automated control uses. Sensing devices usually includes temperature sensors, humidity sensors, pressure sensors, magnetism sensors, illumination sensors, distance sensors, and the like. Among these, ambit light sensors have been extensively applied in various consumer products with the popularization of liquid crystal display (LCD) panels and various mobile devices such as mobile phones, personal digital assistants (PDAs), global positioning systems (GPSs), notebooks, netbooks, and so on. Ambit light sensors are capable of sensing lights in the surrounding to adjust the screen brightness automatically so as to save power. However, these devices merely sense lights with a single wavelength, and the quantum efficiency has yet to be enhanced.

SUMMARY OF THE INVENTION

The invention is directed to an ambit light sensor with a function of infrared ray (IR) sensing. The ambit light sensor with a function of IR sensing is capable of sensing light sources with different wavelengths.

The invention is directed to an ambit light sensor with a function of IR sensing integrated on the same chip.

The invention is directed to an ambit light sensor with a function of IR sensing. The ambit light sensor with a function of IR sensing has high quantum efficiency at visible light wavelengths and is adapted for wavelength requirements of the ambit light sensing.

The invention is directed to a method of fabricating an ambit light sensor with a function of IR sensing, and the process is simple.

The invention is directed to a method of fabricating an ambit light sensor with a function of IR sensing. The fabricating method is capable of saving layout area and saving budget for fabrication of filters so as to reduce material and processing costs.

The invention is directed to an ambit light sensor with a function of IR sensing. The ambit light sensor with a function of IR sensing includes a substrate, an ambit light sensing structure, an IR sensing structure, and a dielectric layer. The ambit light sensing structure is located above the substrate and configured to sense and filter visible light. The IR sensing structure is located in the substrate under the ambit light sensing structure and configured to sense IR. The dielectric layer is located between the ambit light sensing structure and the IR sensing structure.

According to an embodiment of the invention, in the ambit light sensor with a function of IR sensing, the ambit light sensing structure includes a lower electrode, a hydrogenated amorphous silicon layer, and a transparent upper electrode. The lower electrode is located on the dielectric layer. The hydrogenated amorphous silicon layer is located on the lower electrode. The transparent upper electrode covers on the hydrogenated amorphous silicon layer.

According to an embodiment of the invention, in the ambit light sensor with a function of IR sensing, the hydrogenated amorphous silicon layer is a stacked structure including a first conductivity type hydrogenated amorphous silicon layer, an intrinsic hydrogenated amorphous silicon layer, and a second conductivity type hydrogenated amorphous silicon layer. The first conductivity type hydrogenated amorphous silicon layer is located on the lower electrode. The intrinsic hydrogenated amorphous silicon layer is located on the first conductivity type hydrogenated amorphous silicon layer. The second conductivity type hydrogenated amorphous silicon layer is located on the intrinsic hydrogenated amorphous silicon layer. The first conductivity type is an N type and the second conductivity type is a P type.

According to an embodiment of the invention, in the ambit light sensor with a function of IR sensing, a material of the transparent electrode includes transparent conductive oxide and a material of the lower electrode includes metal.

According to an embodiment of the invention, in the ambit light sensor with a function of IR sensing, the ambit light sensing structure is located on a topmost metal layer within a metal interconnect, and the lower electrode is electrically connected with the metal interconnect.

According to an embodiment of the invention, the ambit light sensor with a function of IR sensing further includes a guard ring, which is located around the lower electrode and in the dielectric layer thereunder.

According to an embodiment of the invention, the ambit light sensor with a function of IR sensing further includes a light shielding layer, which covers on a sidewall of the ambit light sensing structure and around an upper surface thereof. The light shielding layer is electrically connected to a pad.

According to an embodiment of the invention, in the ambit light sensor with a function of IR sensing, a height of the ambit light sensing structure is higher than a height of the pad.

According to an embodiment of the invention, in the ambit light sensor with a function of IR sensing, the IR sensing structure includes a well located in the substrate. The well contacts with the substrate, and a conductivity type of the well is different from a conductivity type of the substrate. The well and the substrate constitute a junction diode.

According to an embodiment of the invention, in the ambit light sensor with a function of IR sensing, the ambit light sensing structure covers the well entirely.

According to an embodiment of the invention, the ambit light sensor with a function of IR sensing further includes a passivation layer covering the ambit light sensing structure.

The invention is directed to a method of fabricating an ambit light sensor with a function of IR sensing. The fabricating method includes the following. An IR sensing structure is formed in a substrate to sense IR. Next, a dielectric layer is formed on the substrate. An ambit light sensing structure is then formed on the dielectric layer to cover the IR sensing structure.

According to an embodiment of the invention, in the method of fabricating the ambit light sensor with a function of IR sensing, a method of forming the ambit light sensing structure includes the following. A lower electrode is formed on the dielectric layer. Thereafter, a hydrogenated amorphous silicon layer is formed on the lower electrode. A transparent upper electrode is formed on the hydrogenated amorphous silicon layer subsequently.

According to an embodiment of the invention, in the method of fabricating the ambit light sensor with a function of IR sensing, the hydrogenated amorphous silicon layer is a stacked structure. The stacked structure is formed as follows. A first conductivity type hydrogenated amorphous silicon layer is formed on the lower electrode. Afterwards, an intrinsic hydrogenated amorphous silicon layer is formed on the first conductivity type hydrogenated amorphous silicon layer. A second conductivity type hydrogenated amorphous silicon layer is subsequently formed on the intrinsic hydrogenated amorphous silicon layer.

According to an embodiment of the invention, in the method of fabricating the ambit light sensor with a function of IR sensing, the first conductivity type is an N type and the second conductivity type is a P type.

According to an embodiment of the invention, in the method of fabricating the ambit light sensor with a function of IR sensing, a material of the transparent electrode includes transparent conductive oxide and a material of the lower electrode includes metal.

According to an embodiment of the invention, the method of fabricating the ambit light sensor with a function of IR sensing further includes the following. A metal interconnect is formed in the dielectric layer to connect the lower electrode.

According to an embodiment of the invention, the method of fabricating the ambit light sensor with a function of IR sensing further includes the following. A light shielding layer is formed on a sidewall of the ambit light sensing structure and around an upper surface thereof. The light shielding layer is connected to a pad.

According to an embodiment of the invention, in the method of fabricating the ambit light sensor with a function of IR sensing, a method of forming the IR sensing structure is illustrated as follows. A well is formed in the substrate. The well contacts with the substrate and a conductivity type of the well is different from a conductivity type of the substrate. The well and the substrate constitute a junction diode.

According to an embodiment of the invention, the method of fabricating the ambit light sensor with a function of IR sensing further includes the following. A passivation layer is formed to cover the ambit light sensing structure.

According to an embodiment of the invention, the method of fabricating the ambit light sensor with a function of IR sensing further includes the following. After the passivation layer is formed, the substrate is cut.

The ambit light sensor with a function of IR sensing of the invention is capable of sensing light with different wavelengths.

The ambit light sensor with a function of IR sensing of the invention is integrated on the same chip.

The ambit light sensor with a function of IR sensing of the invention has high quantum efficiency in visible light wavelengths and is adapted for wavelength requirements of the ambit light sensing.

The method of fabricating the ambit light sensor with a function of IR sensing of the invention has a simple process.

The method of fabricating the ambit light sensor with a function of IR sensing of the invention is capable of saving layout area and saving budget for fabrication of filters, and the material and processing costs can be therefore reduced.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A to 1D are cross-sectional views illustrating a method of fabricating an ambit light sensor with a function of infrared ray (IR) sensing according to an embodiment of the invention.

Figure 1A:
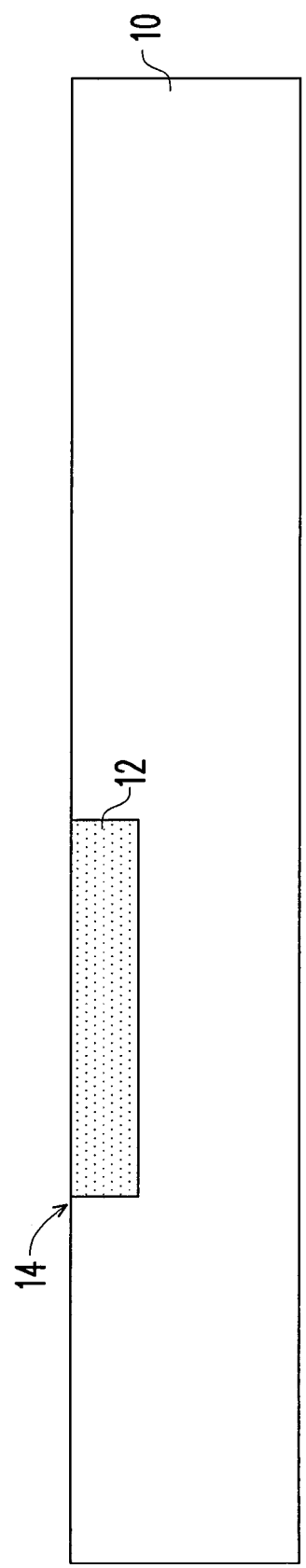
FIGS. 1A to 1D are cross-sectional views illustrating a method of fabricating an ambit light sensor with a function of IR sensing according to an embodiment of the invention.

Referring to FIG. 1A, an IR sensing structure 14 is formed in a substrate 10. A material of the substrate 10 includes a doped semiconductor, for example, such as the silicon substrate 10 having a P-type dopant or the silicon substrate 10 having an N-type dopant. Alternatively, the substrate 10 can also be an undoped silicon substrate. The IR sensing structure 14 is a junction diode, for instance. The junction diode is formed by the following. A well 12 is formed in the substrate 10. The well 12 contacts with the substrate 10, and a conductivity type of the well 12 is different from that of the substrate 10. In an embodiment, the substrate 10 is the P-type doped silicon substrate 10 and the well 12 is the N-type doped region. The well 12 is formed as follows. A mask layer is formed on the substrate 10, for instance. Next, an ion implantation process is performed to implant the dopant into the substrate 10 so as to form the well 12. Thereafter, the mask layer is removed. The P-type dopant implanted in the ion implantation process is, for example, boron. The N-type dopant implanted, for example, is phosphorous or arsenic. In an embodiment, other than the formation of the IR sensing structure 14, a metal oxide semiconductor (MOS) device is further formed on the substrate 10. The MOS device is, for example, an N-type channel field effect transistor (NMOS), a P-type channel field effect transistor (PMOS), or a complementary field effect transistor (CMOS). For simplifying the illustration, these devices are not shown.

Figure 1B:
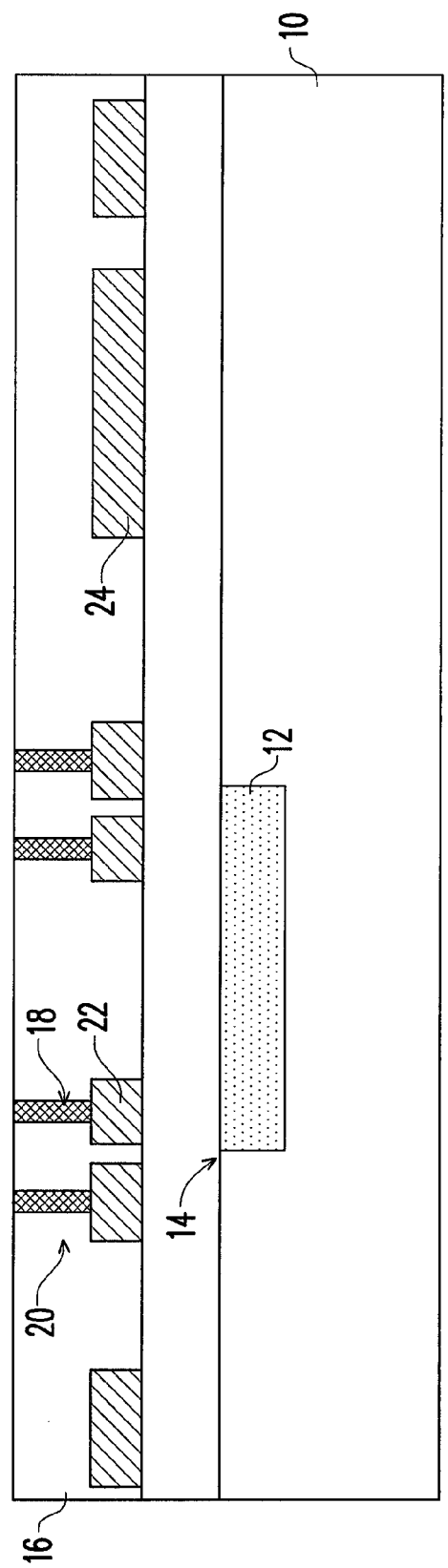

Referring to FIG. 1B, a dielectric layer 16 is formed on the substrate 10. The dielectric layer 16 is fabricated using silicon oxide, borophosphosilicate glass (BPSG), phosphosilicate glass (PSG), undoped silicon glass (USG), fluorine-doped silicon glass (FSG), spin-on-glass (SOG), or a low dielectric constant material with a dielectric constant smaller than 4, for example. The dielectric layer 16 is fabricated by, for example, a chemical vapor deposition (CVD) process or a spin-coating process. Then, a metal interconnect 18 is formed in the dielectric layer 16. To simplify, only a topmost metal layer 22 is illustrated. In an embodiment, a pad 24 is simultaneously formed while the topmost metal layer 22 of the metal interconnect 18 is being formed. In another embodiment, a guard ring 20 is simultaneously formed in the dielectric layer 16 while the metal interconnect 18 is being formed.

Figure 1C:
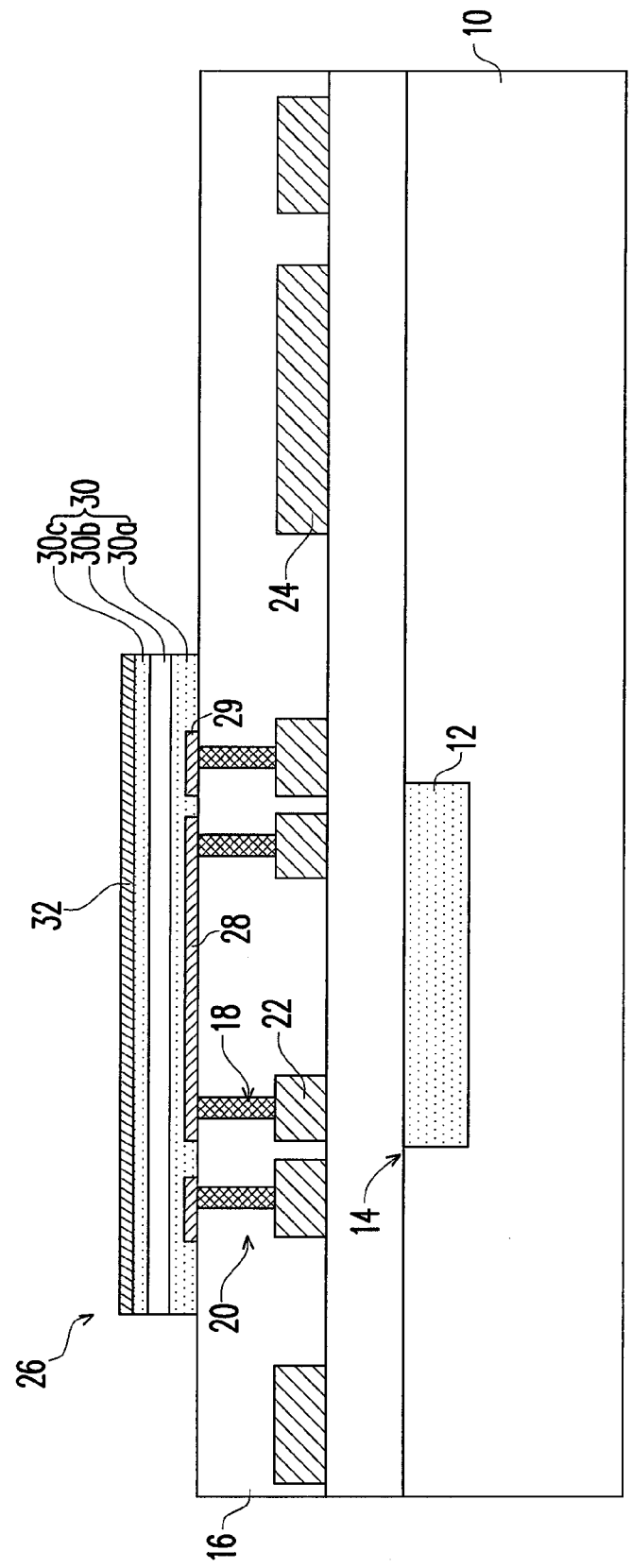

Afterwards, referring to FIG. 1C, an ambit light sensing structure 26 is formed on the dielectric layer 16. In an embodiment, the ambit light sensing structure 26 includes a lower electrode 28, a hydrogenated amorphous silicon layer 30, and a transparent upper electrode 32. The ambit light sensing structure 26 has a larger area and is capable of covering the IR sensing structure 14 entirely.

In an embodiment, the ambit light sensing structure 26 is formed as follows. Firstly, a lower electrode 28 is formed on the dielectric layer 16, so that the lower electrode 28 is electrically connected to a via plug in the metal interconnect 18. The lower electrode 28 is fabricated using metal, such as titanium nitride (TiN), tungsten (W), chromium (Cr), or aluminum (Al). The lower electrode 28 is formed by depositing a lower electrode material layer using a physical vapor deposition (PVD) method or a chemical vapor deposition (CVD) method and then patterning the same with lithographic and etching processes. In an embodiment, when the lower electrode 28 is formed, a topmost layer 29 of the guard ring 20 is simultaneously formed around the lower electrode 28. When the lower electrode 28 is made of metal, a thickness thereof is very thin, such as from about 50 Å to about 500 Å, so that IR can pass therethrough.

Therefore, a hydrogenated amorphous silicon layer 30 is formed on the lower electrode 28. In an embodiment, the hydrogenated amorphous silicon layer 30 is a stacked structure. The stacked structure is formed as follows. A first conductivity type hydrogenated amorphous silicon layer 30 is formed on the lower electrode 28. Afterwards, an intrinsic hydrogenated amorphous silicon layer 30b is formed on the first conductivity type hydrogenated amorphous silicon layer 30a. A second conductivity type hydrogenated amorphous silicon layer 30c is subsequently formed on the intrinsic hydrogenated amorphous silicon layer 30b. In an embodiment, the stacked structure can be deposited by applying a plasma enhanced CVD process, where $B_2H_6/H_2$ and $PH_3/H_2$ are used as reactive gases and the doped types or concentrations of the same are changed in the depositing process. In an embodiment, the stacked structure has a PIN structure. That is, the second conductivity type hydrogenated amorphous silicon layer 30 is a P-type, a thickness thereof ranges from, for example, about 50 Å to about 500 Å, a concentration of the P-type dopant ranges, for example, from $1\times10^{17}$ to $1\times10^{21}$ atoms/cm$^3$, and the P-type dopant is, for instance, boron. The intrinsic hydrogenated amorphous silicon layer 30b has a thickness ranging from about 500 Å to about 5000 Å, for example. The first conductivity type hydrogenated amorphous silicon layer 30 is an N-type, a thickness thereof ranges from about 50 Å to about 500 Å, a concentration of the N-type dopant ranges, for instance, from $1\times10^{17}$ to about $1\times10^{21}$ atoms/cm$^3$, and the N-type dopant is, for example, phosphorous or arsenic.

Thereafter, a transparent upper electrode 32 is formed on the hydrogenated amorphous silicon layer 30. The transparent upper electrode 32 is fabricated using transparent conductive oxide, for example, indium tin oxide (ITO). The transparent upper electrode 32 is deposited by using a sputtering method, for instance. The thickness of the transparent upper electrode 32 ranges from about 500 Å to about 5000 Å.

The hydrogenated amorphous silicon layer 30 (stacked structure) and the transparent upper electrode 32 are fabricated, for example, by depositing the stacked structure material layer and the transparent upper electrode material layer, and then patterning the same with lithographic and etching processes.

Figure 1D:
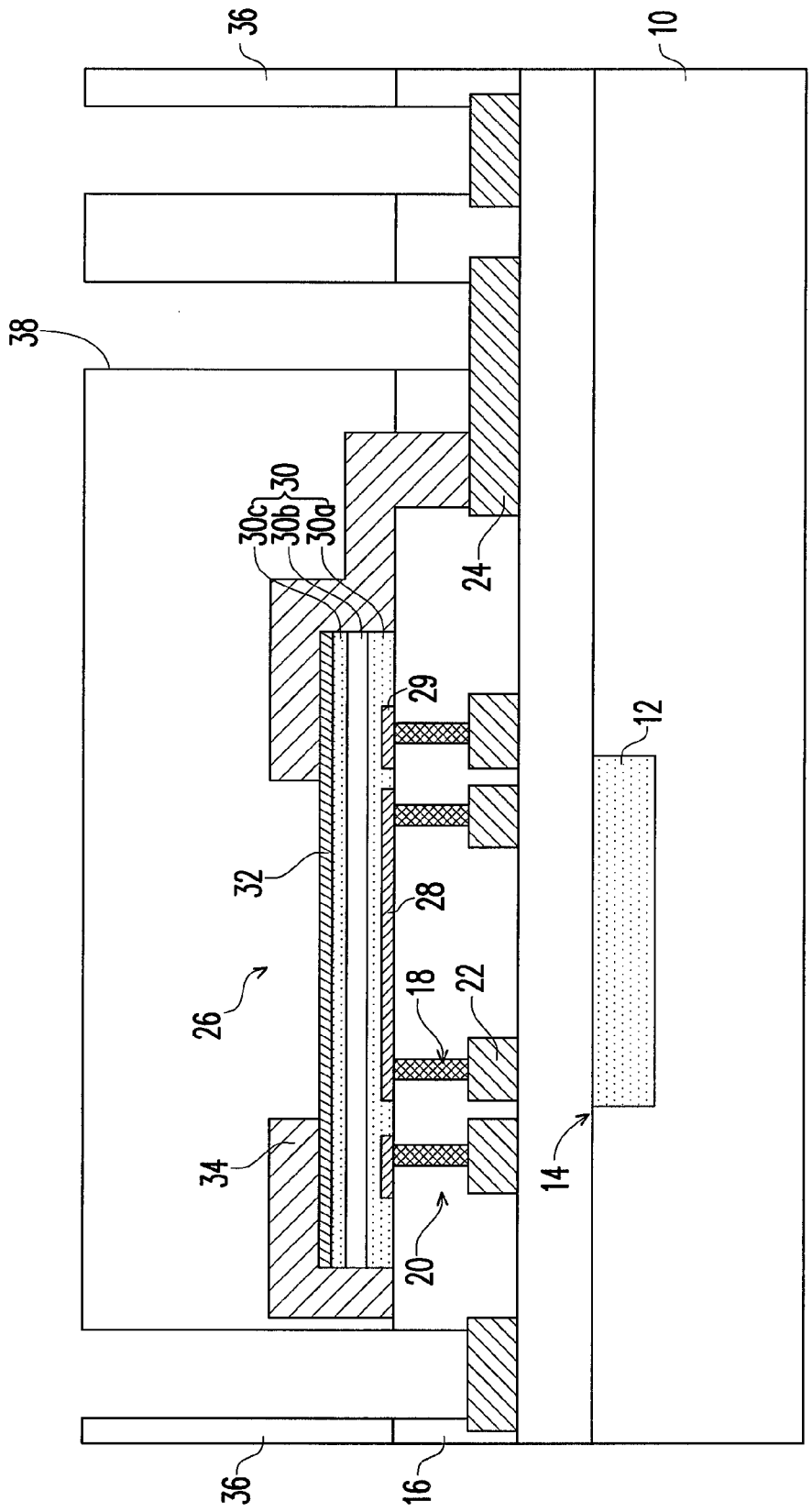

Afterwards, referring to FIG. 1D, a light shielding layer 34 is formed on a sidewall of the ambit light sensing structure 26 and around an upper surface thereof. The light shielding layer 34 is connected with the pad 24, such that leakage current from the sidewall of the ambit light sensing structure 26 is directed to the pad 24. The light shielding layer 34 is fabricated using metal, such as Al, TiN, W, or a black color filter. Subsequently, a passivation layer 36 is formed on the substrate 10 to cover the ambit light sensing structure 26. The passivation layer 36 is fabricated using polyimide, for instance. Thereafter, a pad window 38 is formed in the passivation layer 36 to expose the pad 24.

The following processes include cutting the substrate, packaging, and so on, and the detailed descriptions are omitted herein. After cutting and packaging, the ambit light sensor with a function of IR sensing is consequently formed. Here, IR sensor and the ambit light sensor are integrated on the same chip to sense the light of dual wavelength regions.

Referring to FIG. 1D, the ambit light sensor with a function of IR sensing of the present embodiment includes the substrate 10, the IR sensing structure 14, the ambit light sensing structure 26, and the dielectric layer 16. The IR sensing structure 14 is located in the substrate 10 under the ambit light sensing structure 26 and configured to sense IR. The ambit light sensing structure 26 is located above the substrate 10 and configured to sense and filter visible light. The dielectric layer 16 is located between the ambit light sensing structure 26 and the IR sensing structure 14.

More specifically, the IR sensing structure 14, for instance, is a junction diode which is constituted by the substrate 10 and the well 12 therein, and is configured to sense IR. The ambit light sensing structure 26 includes the lower electrode 28, the hydrogenated amorphous silicon layer 30, and the transparent upper electrode 32. The lower electrode 28 is located on the dielectric layer 16. The hydrogenated amorphous silicon layer 30 is located on the lower electrode 28. The transparent upper electrode 32 covers on the hydrogenated amorphous silicon layer 30. In an embodiment, the hydrogenated amorphous silicon layer 30 is a stacked structure. The stacked structure includes the first conductivity type hydrogenated amorphous silicon layer 30 located on the lower electrode 28, the intrinsic hydrogenated amorphous silicon layer 30b located on the first conductivity type hydrogenated amorphous silicon layer 30a, and the second conductivity type hydrogenated amorphous silicon layer 30c located on the intrinsic hydrogenated amorphous silicon layer 30b. Here, the first conductivity type is an N-type and the second conductivity type is a P-type. In an embodiment, the lower electrode 28 is electrically connected to the metal interconnect 18 in the dielectric layer 16. The sidewall of the ambit light sensing structure 26 and the upper surface of the transparent upper electrode 32 are covered by the light shielding layer 34. The light shielding layer 34 is connected with the pad 24, such that leakage current from the sidewall of the ambit light sensing structure 26 is directed to the pad 24.

When the light passes through the ambit light sensing structure, the visible light wavelengths are sensed and filtered by the ambit light sensing structure. As the light proceeds and passes through the dielectric layer to reach the IR sensing structure, the IR wavelengths are then sensed by the IR sensing structure. Thus, the invention has the function of sensing two wavelength ranges of the light.

In the above embodiment, the ambit light sensing structure 26 is disposed on the topmost metal layer 22 of the metal interconnect 18. However, practical application is not limited thereto. The ambit light sensing structure 26 can be disposed between any two metal layers of the metal interconnect 18 when the processing condition permits.

Figure 2:
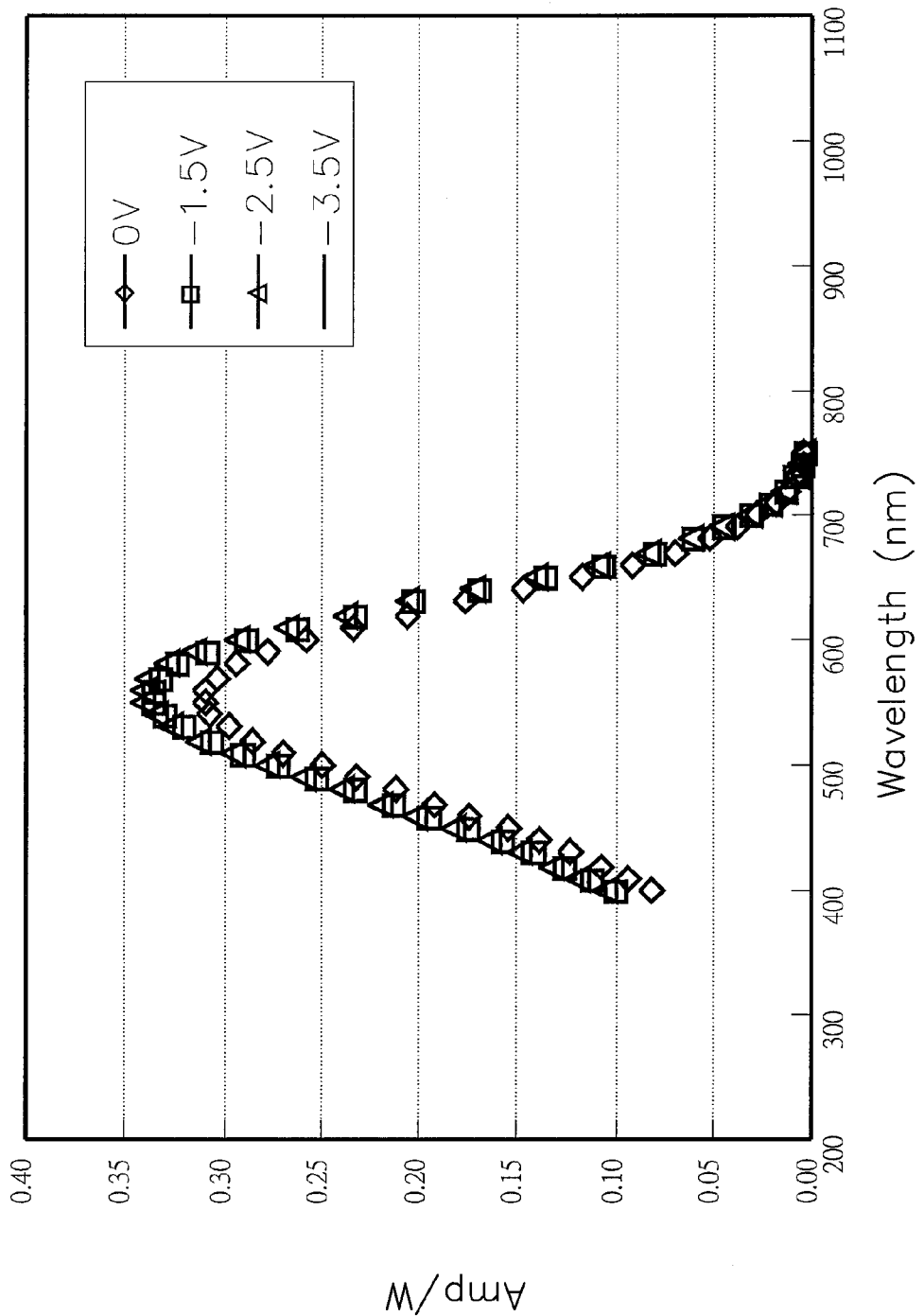
FIG. 2 is a photoresponse diagram of applying different voltages to an ambit light sensing structure of a hydrogenated amorphous silicon layer at 25° C.

FIG. 2 is a photoresponse diagram of applying different voltages to an ambit light sensing structure of a hydrogenated amorphous silicon layer at 25° C. From the result shown in FIG. 2, when applied with different voltages, the largest current is generated at a wavelength about 550 nm.

Figure 3:
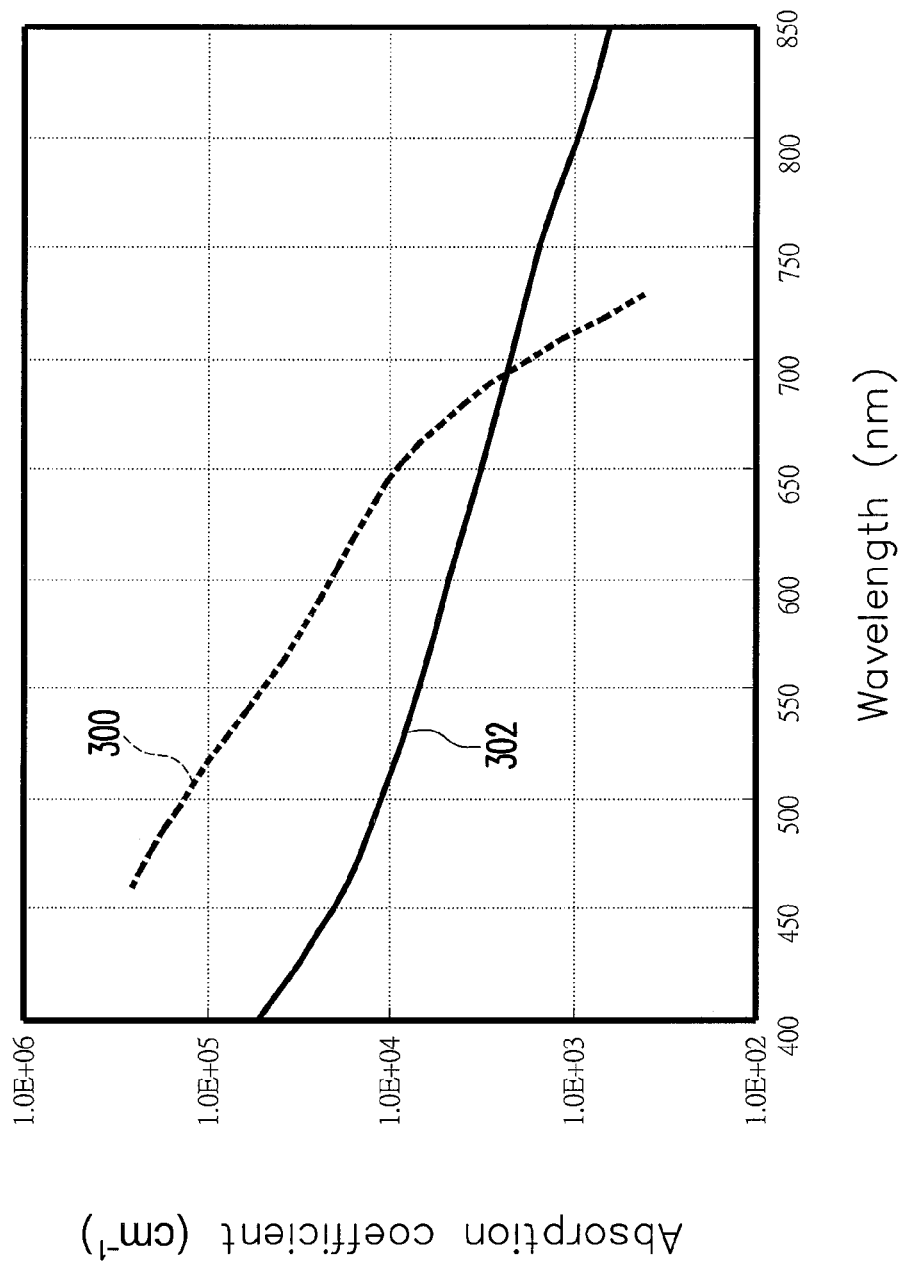
FIG. 3 is an absorption spectrum of a hydrogenated amorphous silicon layer and a crystalline silicon layer.

FIG. 3 is an absorption spectrum of a hydrogenated amorphous silicon layer and a crystalline silicon layer. Line 300 is an absorption curve of a hydrogenated amorphous silicon layer. FIG. 3 illustrates that the hydrogenated amorphous silicon layer is capable of absorbing visible light wavelengths. Line 302 illustrates an absorption curve of the crystalline silicon layer and shows that the hydrogenated amorphous silicon layer is capable of absorbing IR wavelengths.

In summary, the invention integrates the functions of the ambit light sensor and the IR sensor on the same chip. The ambit light sensing structure 26 in the sensor not only senses ambit light such as visible lights, but is also used as the filter of visible lights for the IR sensor thereunder. Therefore, an additional filter for the IR sensor is not required. As a consequence, the fabrication thereof is simple, so that the layout area and the budget of the filter fabrication can be saved. The costs for material and fabrication are thus low. Furthermore, the invention is directed to the ambit light sensor with a function of IR sensing. The ambit light sensor with a function of IR sensing adopts hydrogenated amorphous silicon as the ambit light sensing structure, which has high quantum efficiency in visible light wavelengths and is adapted for wavelength requirements of the ambit light sensing. In addition, the ambit light sensor with a function of IR sensing of the present embodiment can be integrated with the semiconductor fabrication.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An ambient light sensor with a function of infrared ray sensing, comprising:
    a substrate, wherein a material of the substrate includes a semiconductor;
    an ambient light sensing structure, located above the substrate and configured to sense and filter visible light;
    an infrared ray sensing structure, located in the substrate under the ambient light sensing structure and configured to sense infrared ray, wherein the ambient light sensing structure covers the infrared ray sensing structure entirely; and
    a dielectric layer, located between the ambient light sensing structure and the infrared ray sensing structure, wherein a metal interconnect is formed in the dielectric layer and the ambient light sensing structure is not electrically connected to the infrared ray sensing structure through the metal interconnect.

2. The ambient light sensor with a function of infrared ray sensing as claimed in claim 1, wherein the ambient light sensing structure comprises:
    a lower electrode, located on the dielectric layer;
    a hydrogenated amorphous silicon layer, located on the lower electrode; and
    a transparent upper electrode, covering on the hydrogenated amorphous silicon layer.

3. The ambient light sensor with a function of infrared ray sensing as claimed in claim 2, wherein the hydrogenated amorphous silicon layer is a stacked structure comprising:
    a first conductivity type hydrogenated amorphous silicon layer, located on the lower electrode;
    an intrinsic hydrogenated amorphous silicon layer, located on the first conductivity type hydrogenated amorphous silicon layer; and
    a second conductivity type hydrogenated amorphous silicon layer, located on the intrinsic hydrogenated amorphous silicon layer.

4. The ambient light sensor with a function of infrared ray sensing as claimed in claim 3, wherein the first conductivity type is an N type and the second conductivity type is a P type.

5. The ambient light sensor with a function of infrared ray sensing as claimed in claim 2, wherein a material of the transparent electrode comprises a transparent conductive oxide and a material of the lower electrode comprises a metal.

6. The ambient light sensor with a function of infrared ray sensing as claimed in claim 2, wherein the ambient light sensing structure is located on a topmost metal layer of a metal interconnect, and the lower electrode is electrically connected with the metal interconnect.

7. The ambient light sensor with a function of infrared ray sensing as claimed in claim 2, further comprising a guard ring located around the lower electrode and in the dielectric layer thereunder.

8. The ambient light sensor with a function of infrared ray sensing as claimed in claim 1, further comprising a light shielding layer covering on a sidewall of the ambient light sensing structure and around an upper surface thereof, and the light shielding layer being electrically connected to a pad.

9. The ambient light sensor with a function of infrared ray sensing as claimed in claim 8, wherein a height of the ambient light sensing structure is higher than a height of the pad.

10. The ambient light sensor with a function of infrared ray sensing as claimed in claim 1, wherein the infrared ray sensing structure comprises a well located in the substrate, the well contacts with the substrate and a conductivity type of the well is different from a conductivity type of the substrate, and the well and the substrate constitute a junction diode.

11. The ambient light sensor with a function of infrared ray sensing as claimed in claim 1, further comprising a passivation layer covering the ambient light sensing structure.

12. A method of fabricating an ambient light sensor with a function of infrared ray sensing, comprising:
    forming an infrared ray sensing structure in a substrate to sense infrared ray, wherein a material of the substrate includes a semiconductor;
    forming a dielectric layer on the substrate;
    forming a metal interconnect in the dielectric layer; and
    forming an ambient light sensing structure on the dielectric layer to cover the infrared ray sensing structure entirely, and the ambient light sensing structure is not electrically connected to the infrared ray sensing structure through the metal interconnect.

13. The method of fabricating the ambient light sensor with a function of infrared ray sensing as claimed in claim 12, wherein a method of forming the ambient light sensing structure comprises:
    forming a lower electrode on the dielectric layer;
    forming a hydrogenated amorphous silicon layer on the lower electrode; and
    forming a transparent upper electrode on the hydrogenated amorphous silicon layer.

14. The method of fabricating the ambient light sensor with a function of infrared ray sensing as claimed in claim 13, wherein the hydrogenated amorphous silicon layer is a stacked structure, and a method of forming the stacked structure comprises:
    forming a first conductivity type hydrogenated amorphous silicon layer on the lower electrode;
    forming an intrinsic hydrogenated amorphous silicon layer on the first conductivity type hydrogenated amorphous silicon layer; and forming a second conductivity type hydrogenated amorphous silicon layer on the intrinsic hydrogenated amorphous silicon layer.

15. The method of fabricating the ambient light sensor with a function of infrared ray sensing as claimed in claim 14, wherein the first conductivity type is an N type and the second conductivity type is a P type.

16. The method of fabricating the ambient light sensor with a function of infrared ray sensing as claimed in claim 13, wherein a material of the transparent electrode comprises a transparent conductive oxide and a material of the lower electrode comprises a metal.

17. The method of fabricating the ambient light sensor with a function of infrared ray sensing as claimed in claim 13, further comprising forming a metal interconnect connecting the lower electrode in the dielectric layer.

18. The method of fabricating the ambient light sensor with a function of infrared ray sensing as claimed in claim 12, further comprising forming a light shielding layer on a sidewall of the ambient light sensing structure and around an upper surface thereof, and electrically connecting the light shielding layer to a pad.

19. The method of fabricating the ambient light sensor with a function of infrared ray sensing as claimed in claim 12, wherein a method of forming the infrared ray sensing structure comprises forming a well in the substrate, the well contacts with the substrate and a conductivity type of the well is different from a conductivity type of the substrate, and the well and the substrate constitute a junction diode.

20. The method of fabricating the ambient light sensor with a function of infrared ray sensing as claimed in claim 12, further comprising forming a passivation layer to cover the ambient light sensing structure.

21. The method of fabricating the ambient light sensor with a function of infrared ray sensing as claimed in claim 20, further comprising cutting the substrate after forming the passivation layer.

* * * * *